US008779794B2

(12) United States Patent
Bernoux et al.

(10) Patent No.: US 8,779,794 B2
(45) Date of Patent: Jul. 15, 2014

(54) TRANSISTOR POWER SWITCH DEVICE AND METHOD OF MEASURING ITS CHARACTERISTICS

(75) Inventors: Beatrice Bernoux, Tournefeuille (FR); Rene Escoffier, Mauzac (FR); Jean Michel Reynes, Pompertuzat (FR)

(73) Assignee: Freescale Semiconductor, Inc., Austin, TX (US)

( * ) Notice: Subject to any disclaimer, the term of this patent is extended or adjusted under 35 U.S.C. 154(b) by 223 days.

(21) Appl. No.: 13/389,194

(22) PCT Filed: Aug. 18, 2009

(86) PCT No.: PCT/IB2009/055086
§ 371 (c)(1),
(2), (4) Date: Feb. 6, 2012

(87) PCT Pub. No.: WO2011/021076
PCT Pub. Date: Feb. 24, 2011

(65) Prior Publication Data
US 2012/0133388 A1    May 31, 2012

(51) Int. Cl.
*G01R 31/26* (2014.01)
(52) U.S. Cl.
USPC .................................... 324/762.01
(58) Field of Classification Search
CPC ............ H01L 29/7808; H01L 29/7815; G01R 31/129; G01R 31/275
See application file for complete search history.

(56) References Cited

U.S. PATENT DOCUMENTS 5,115,369 A    5/1992  Robb et al.
7,432,145 B2 *  10/2008  Reynes et al. ............... 438/193
7,667,265 B2 *  2/2010  Wang et al. .................. 257/330
2006/0145252 A1  7/2006  Reynes et al.
2008/0157405 A1  7/2008  Knickerbocker

FOREIGN PATENT DOCUMENTS

EP          0139998 A1    5/1985
WO      2010/061244 A1    6/2010
WO      2010/061245 A1    6/2010

OTHER PUBLICATIONS

Bernoux B et al: "Power MOSFET RDSon Under Repetitive Avalanche Cycling" IEEE International Symposium on Industrial Electronics (ISIE 2009), Seoul, KR, Jul. 5-8, 2009, pp. 2016-2019.

(Continued)

*Primary Examiner* — Tung X Nguyen

(57) ABSTRACT

A transistor power switch device comprising an array of vertical transistor elements for carrying current between first and second faces of a semiconductor body. The device also comprises a semiconductor monitor element comprising first and second semiconductor monitor regions in the semiconductor body and a monitor conductive layer distinct from the current carrying conductive layer of the transistor array. The semiconductor monitor element presents semiconductor properties representative of the transistor array. Characteristics of the semiconductor monitor element are measured as representative of characteristics of the transistor array. Source metal ageing of a transistor power switch device is monitored by measuring and recording a parameter which is a function of a sheet resistance of the monitor conductive layer when the transistor power switch device is new and comparing it with its value after operation of the device. A measured current is applied between a first location on an elongate strip element of the monitor conductive layer and a first location on one of a pair of lateral extensions of the strip, and the corresponding voltage developed between a second location on the elongate strip element and the other of said pair of lateral extensions is measured.

14 Claims, 5 Drawing Sheets

(56) References Cited

OTHER PUBLICATIONS

Feldbaumer D W et al: "Design and Application of the Interlayer Van Der Pauw Resistor Alignment Bridge" IEEE Transactions ON Semiconductor Manufacturing, vol. 3, No. 4, Nov. 1990, pp. 206-215.
International Search Report and Written Opinion correlating to PCT/IB2009/055086 dated Jun. 17, 2010.

* cited by examiner

US 8,779,794 B2

TRANSISTOR POWER SWITCH DEVICE AND METHOD OF MEASURING ITS CHARACTERISTICS

FIELD OF THE INVENTION

This invention relates to a transistor power switch device and to a method of measuring characteristics of such a device.

BACKGROUND OF THE INVENTION

Measurements of characteristics of transistor power switch devices are performed at various stages of their production and use. For example, the supplier makes non-destructive measurements of operating parameters and physical characteristics of wafers and dies to detect risks of defects in production batches and to control variation of production process parameters and makes potentially destructive tests of die samples, measuring the effects of the tests on the samples. Any failure of delivered products in the field during use usually results in the customer returning the failed products to the supplier for analysis, which again leads to measurement of the characteristics of the failed product.

Examples of measurements which may be made include semiconductor horizontal and vertical doping profiles and dimensioning. The metal layer resistivity may be measured and recorded. The correct positioning of manufacturing operations, including wire bonding positions for example, may be guided by fiducial marks and the resulting features measured relative to such marks.

Another example of a characteristic of a transistor power switch device is its resistance to avalanche breakdown, especially its resistance to large numbers of repetitive avalanche breakdown occurrences. Avalanche breakdown of a transistor power switch can be caused by unclamped inductive switching ('UIS'). Power transistors such as metal-oxide-silicon field-effect transistors ('MOSFET's) inherently have extremely fast switching speeds and consequently are particularly exposed to repetitive avalanche breakdowns. Our co-pending international patent applications PCT/IB2008/055655 and PCT/IB2008/055656 relate to vertical MOSFET power switch devices. The resistance of power switch devices to repetitive high avalanche currents is important, whether or not avalanche diodes are provided to protect the power switch device as in our patent application PCT/IB2008/055655, since the power switch device may be exposed in use to hundreds of millions of avalanche breakdown current occurrences. Measurements are needed of parameters which are symptomatic of product ageing due to avalanche breakdown current occurrences or are likely to contribute to premature avalanche breakdown current failure.

SUMMARY OF THE INVENTION

The present invention provides a transistor power switch device and a method of measuring characteristics of a transistor power switch device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
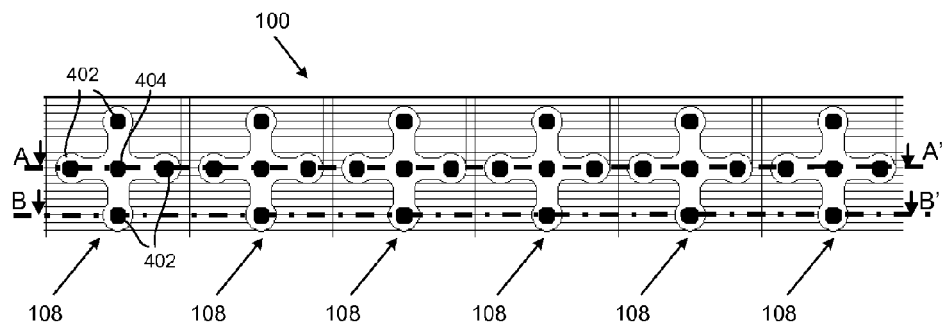
FIG. 1 is a plan view of part of an array of power switch elements in an example of a transistor power switch device.

Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale; in particular, the size of the depths in the semiconductor devices is shown exaggerated relative to the lateral dimensions for illustrative purposes.

Figure 2:
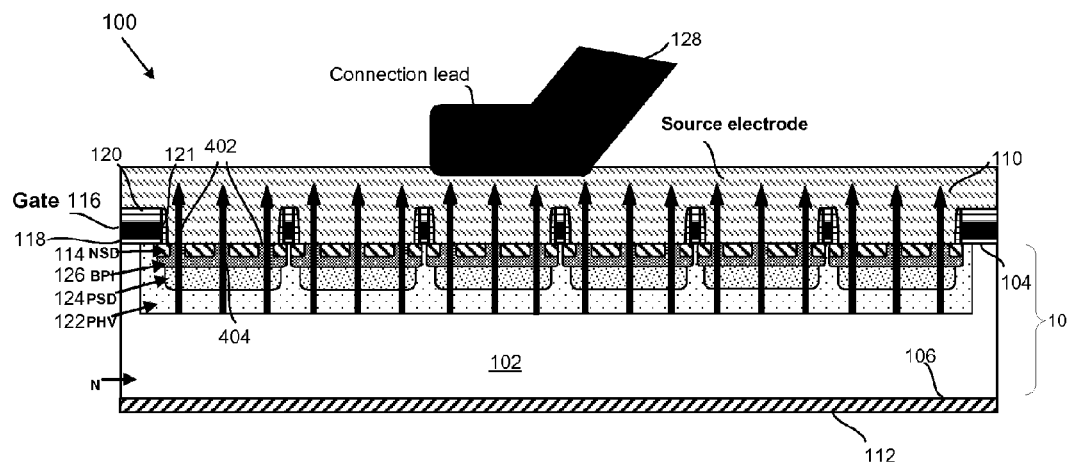
FIG. 2 is a sectional view of the example of FIG. 1 taken along the line A-A' of FIG. 1.
Figure 3:
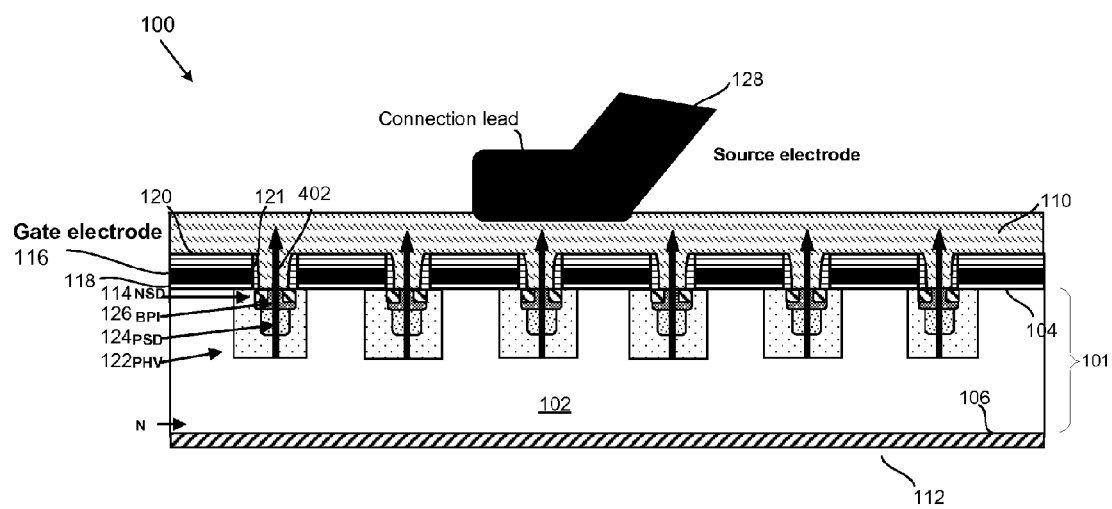
FIG. 3 is a sectional view of the example of FIG. 1 taken along the line B-B' of FIG. 1.

FIGS. 1 to 3 show a transistor power switch device 100 of the kind described in our co-pending international patent applications numbers PCT/IB2008/055655 and PCT/IB2008/055656, comprising an array of base cells each comprising vertical insulated gate metal-oxide-silicon field-effect transistors ('MOSFET's) 108, to which the present invention can be applied. A device of this kind is made with a high cell density, having several hundred-thousand or even several million cells per square centimeter of active semiconductor substrate, so as to reduce the ON-state resistance, while avoiding comparable deterioration of the breakdown and unclamped inductive switching ('UIS') avalanche voltages. It will be appreciated that the drawings only show a very small part of the total number of cells.

The transistor power switch device 100 is an n-type device, although p-type devices are also possible. The transistor power switch device 100 comprises a semiconductor body formed from a substrate 101 of a first semiconductor type, in this example n-type, presenting opposite first and second faces 104 and 106. The transistor power switch device 100 further comprises an array of vertical MOSFET elements 108 which, in operation, carries current between the first and second faces 104, 106. A drain electrode 112 contacts the second face 106 of the n-type drain region 102 formed by the substrate 101 which is shared by the transistor elements 108 and a source electrode 110 deposited on the first face 104 contacts the separate n-type source dopant regions 114 of the vertical transistor elements 108. The transistor elements 108 of the array comprise at the first face 104 an array of first current carrying transistor regions 114 of a first semiconductor type, in this example n-type source dopant regions, and at least one second current carrying transistor region 122, 124, 126 of a second semiconductor type opposite to the first type, in this example a p-type region, interposed between the first semiconductor source regions and the second face 106. The second region in the substrate 101 comprises a lightly doped p-type high voltage ('PHV') body or well, region 122 and a more heavily doped p-type doped ('PSD') region 124 within the PHV region 122, together with boron protection implant ('BPI') regions 126 interposed between the PSD regions 124 and the source regions 114. While the MOSFET base cells 108 may comprise second, body, regions which are separate from each other, in this example, the body regions merge together between and underneath the first, source regions 114 to form a single body region 122. The array of vertical MOSFET base cells 108 also comprises a gate electrode 116 for switchably controlling flow of said current in the body region 122. Again, although an array of connected gate electrodes can be provided, in this example the gate electrodes are elements of a single gate electrode layer. The electrodes are not necessarily metallic but may be made of other conductive materials, such as polysilicon, for example. However, typically the source electrode 110 is formed of metal deposited on the face 104, such as copper or, in this example, aluminium. The drain region 102 of the substrate, the p regions 122, 124, 126 and the source regions 114 emerge at the face 104 of the substrate. The gate electrode 116 is insulated from the face 104 by an insulating layer 118 and the gate electrode 116 is insulated from the source electrode 110 by an insulating layer 120 with insulating spacers 121 insulating the edges of the gate electrode. Hereafter the block consisting of the layers 118, 116, 120 is referred to as the "gate stack".

Various suitable manufacturing methods are available to produce the transistor power switch device 100. U.S. patent application publication US 2006-0145252 describes a method of making a transistor power switch device comprising an array of vertical insulated gate 'MOSFET's which can be adapted to manufacture a device in accordance with the present invention.

Additional PSD contacts 402 are provided by the PSD region 124 emerging at the face 104 within the base cells at the ends of the arms of the base cells as well as at their centres 404, in this case providing four additional PSD contacts 402 to the source electrode 110. In order to accommodate the additional PSD contacts the gate stack and source region shapes are modified at the ends of the branches as illustrated in the FIG. 1. These additional PSD contacts increase the source-drain voltage that the FETs can withstand without activating avalanche current in the parasitic bipolar npn transistors.

In the transistor power switch device 100, the source region 114 of each of the vertical transistor elements 108 contacting the conductive layer 110 comprises a plurality of arms extending radially at the first face 104 towards an arm of a source region 114 of an adjacent vertical transistor element 108 of the array. The PHV body region 122 extends around and under the arms of the source regions 114. The PHV body region 122 is connected to the conductive layer 110 through the PSD regions 124 and the BPI regions 126, the BPI regions extending, within each of the source regions, upward through the layers above the BPI regions to contact the conductive layer 110 at the first face 104 at a contact position 402 adjacent to an end of each of the arms of the source regions 114 of the vertical transistor elements 108. The PHV body region 122 is also connected to the conductive layer 110 through the PSD regions 124 and the BPI regions 126, extending up within each of the source regions to contact the conductive layer 110 at the first face 104 at a contact position 404 central to each of the source regions 114 of the vertical transistor elements 108. The end of each of the arms of the source regions 114 is enlarged at the first face 104 around the contact position 402.

In the example of FIGS. 1 to 3, the source electrode 110 covers the array of MOSFET base cells 108 continuously, apart from an area for contact to the gate electrode 116, and makes electrical contact through the openings in the gate stack 116 to 120 with the source regions 114 and also with the PHV region 124 through the BPI regions 126 at the contacts 402 and 404 and through the PSD regions 124 to ensure that there is no bias voltage to trigger the parasitic source-body-drain bipolar junction transistor structure even at the ends of the arms of the cross-shaped base cells. The gate electrode 116 overlaps the PHV body region 124 at the face 104 so that, in operation, a positive voltage applied to it relative to the source electrode 110 will create an inversion layer in the body region 122 forming a channel in the PHV region 122 at the face 104 under the gate electrode, the channel conducting the ON-current of the device when a positive voltage is applied to the drain electrode 112 relative to the source electrode 114. The ON-current flows up from the drain electrode 112 towards the face 104 adjacent the pn junction between the drain region 102 and the PHV body region 122 and then through the channels under the gate electrode to the source regions 114 of all the MOSFETs 108. The gate electrode may be a single layer common to all the base cells 108 or may comprise more than one laterally separated layers with suitable electrical connections. A contact (not shown in FIGS. 1 to 3) to the gate electrode may be present at an edge of the device 100. A contact to the drain electrode 112 may be made through the mounting of the device 100 to its casing (not shown in FIGS. 1 to 3). An electrical connection may be made to the source electrode 110 by bonding an electrical connection lead 128 to the conductive layer of the source electrode 110 at a position directly over the MOSFETs 108. In this example, the electrical connection lead 128 is a bonding wire.

In operation, in the OFF-state, with the gate maintained at the same voltage as the source, the drain-source voltage reverse biases the p-n junctions between the PHV body region 122 and the drain region 102 in the substrate 101. When the drain-source voltage increases, due to UIS for example, to a value at which the p-n junctions between the PHV body regions 122 and the drain region 102 exceed a threshold value, the p-n junctions break down due to the avalanche effect, as shown by the vertical arrows in FIGS. 2 and 3. The electrical connections 402 of the PHV region 122 to the source electrode 110 through the PSD and BPI regions at the ends of the arms of the source regions 114 and the electrical connections 404 at the centres of the source regions prevent the establishment of a voltage gradient along the arms of the source regions 114 in the PHV region 122 due to leakage currents, for example, and increase the hold-off voltage of the cells.

However, the gate stack is interposed between the source electrode 110 and the substrate 101 and limits the area of the source electrode 110 that is intimately in contact with the substrate 101. Not only does this limitation of contact area concentrate the flow of current, increasing the local current density and localising the generation of heat due to the flow of current through the electrically resistive material of the substrate, but in addition the electrical insulation of the gate stack is also a thermal insulation, limiting the capacity of the source electrode material to extract the heat generated. The heating effect is substantial, since the current flowing through the device 100 in UIS conditions can reach several hundred Amperes for a source-drain voltage of 30 V in one example.

As described in described in our co-pending international patent applications numbers PCT/IB2008/055655 and PCT/IB2008/055656, the device 100 may include in addition a reverse biased vertical repetitive avalanche protection diode 406 (not shown in FIGS. 1 to 3) in the semiconductor body 101 electrically in parallel with the array of transistors 108 for repetitively conducting breakdown current between the faces 104 and 106 of the device in the OFF-state of the device, the repetitive avalanche protection diode having a first current carrying region in contact with the conductive source electrode layer 110, and a second semiconductor region which is electrically connected with the second face 106 and which is situated under the first current carrying region. The first current carrying region of the repetitive avalanche protection diode is of the same second conductivity type as the p regions 122 to 126 of the MOSFETs 108, and the second semiconductor region is of the same first conductivity type as the drain regions 102 of the MOSFETs 108, in this example n-type.

In operation of the power switch device, in the ON-state of the MOSFETs 108, the gate 116 is biased positively relative to the source electrode 110 by a voltage slightly greater than the threshold voltage Vth of the MOSFETs 108 and the drain electrode is biased positively relative to the source electrode 110, the repetitive avalanche protection diode 406 being reverse biased in this condition. In normal operation of the MOSFETs 108, in the ON-state the current passes first vertically up from the drain electrode 112 in the drain region 102 towards the face 104 at the perimeters of the PHV body regions 122 then laterally through the channel under the gate electrode in the PHV region 122 at the perimeters of the source regions 114 of the MOSFETs 108.

In the OFF-state of the MOSFETs 108, with the gate electrode 116 shorted to the source electrode 110, avalanche current through the repetitive avalanche protection diode 406 passes first vertically through the second current carrying region in the substrate 101, then through the layers of the first current carrying region, presenting a short current conduction path and minimising heat generation. Avalanche current in the MOSFETs 108 also passes vertically, through the p regions 122, 124 and 126, but is restricted to an aggregate area at the face 104 less than the total area of the array of MOSFETs 108 by the interposed gate stack 116 to 120. The conductive source electrode layer 110 covers the repetitive avalanche protection diode as well as the MOSFETs 108 and electrical and thermal contact of the first current carrying region with the conductive electrode layer 110 is continuous over substantially the whole area of the first current carrying region of the repetitive avalanche protection diode at the face 104, unimpeded by any layer of insulator material. There may be one or more repetitive avalanche protection diodes for one or more arrays of MOSFETs 108.

The area of the repetitive avalanche protection diode 406 and, more specifically, the area of its p region at the first face 104 and contacting the source electrode conductive layer 110 is several orders of magnitude greater than areas of the individual MOSFETs 108. In one example, an individual MOSFET base cell 108 measures 50 to 100 µm$^2$ and the electrical connection lead wire 128 is approximately 250 to 380 82 m diameter, whereas an individual repetitive avalanche protection diode 406 measures 500 000 µm$^2$. However, there are several orders of magnitude more MOSFETs in the array than the diode. In one example of implementation, there are ten protection diodes 406 on a single power switch chip, the total repetitive avalanche protection diode area is 5 000 000 µm$^2$ and represents between 5% and 30% of the total die area in this example, the aggregate active area of the array of MOSFET base cells 108 being 56 mm$^2$ (56 000 000 µm$^2$).

Figure 4:
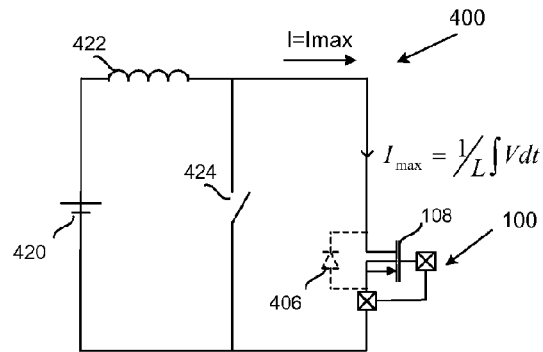
FIG. 4 is a schematic circuit diagram of a circuit for applying one kind of unclamped inductive switching voltages to a transistor power switch device.
Figure 6:
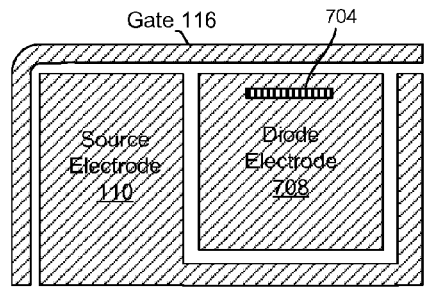
FIG. 6 is a plan view of part of the transistor power switch device of FIG. 5 including the semiconductor monitor element.
Figure 7:
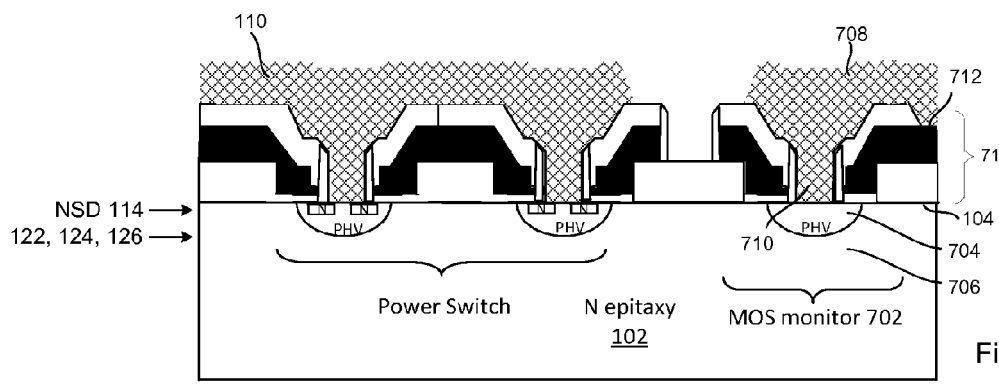
FIG. 7 is a sectional view of the transistor power switch device of FIG. 5 including the semiconductor monitor element.

FIG. 4 shows schematically a UIS test circuit 400 simulating one kind of real usage cases in which UIS current is applied repetitively to the device 100. The switching device 100 includes a large number of the MOSFET cells 108 although only one is shown in FIG. 4 for simplicity, and the switching device 100 may include one or more repetitive avalanche protection diodes 406, of which one is shown in dotted lines in FIG. 4. The circuit 400 includes a direct current (DC) power supply connected across the corresponding to apply the normal operational voltage of the switching device 100 across its drain-source electrodes, for example 15V to 30V in this example. The gate of the switching device 100 is maintained at the same voltage as its source so that it is in the OFF-state. The test circuit 400 also includes an inductance 422 in series with the switching device 100 and a switch 424 in parallel with the switching device 100 across the series connection of the power supply 420 and the inductance 422. In operation of the test circuit 400, the switch 424 is repeatedly opened and closed so as to cause UIS voltage to be applied repeatedly across the drain-source electrodes of the switching device 100, typically millions of times FIGS. 5 to 7 of the drawings show a transistor power switch device 700 similar to the transistor power switch device 100 but with the addition of a vertical monitor diode 702 having an anode region 704 in the substrate 102 at the face 104 and a cathode region 706 contacting the drain electrode 112. The anode and cathode regions 704 and 706 are formed simultaneously with the array of MOSFET cells 108 and by the same manufacturing steps as the array of MOSFET cells 108 but without a source region like the source regions 114 of the cells 108. Accordingly, the doping densities and depths of the anode region 704 and cathode region 706 of the monitor diode 702 are of the same types as, and are representative of, the corresponding PHV, PSD and BPI regions 122, 124, 126 and the corresponding drain region 102 of the MOSFET cells 108 of the power switch 700 respectively. The anode electrode 708 of the monitor diode 702 is distinct, separate and insulated from the source electrode 110 and is accessible to probes, but it is manufactured in the same material and by the same manufacturing steps as the source electrode 110 so that it exhibits identical intrinsic characteristics. The anode electrode 708 connects to the anode region 704 of the diode 702 at the face 104 of the substrate 101 through an aperture 710 in a gate structure 711 similar to, and formed simultaneously with and by the same manufacturing steps as the gate stacks 116 to 120 of the MOSFET elements 108. The anode electrode 708 is also shorted to the polysilicon layer of the gate structure 711 through an aperture 712 in the layer 120 insulating the polysilicon layer of the gate structure 711 from the gate 116 and from the source electrode 110. Accordingly, the voltage of the gate element in the zone of diode 702 follows the voltage of the anode electrode 708 of the diode, eliminating any capacitance effects of the gate element. In this example, the anode 708 of the monitor diode is separate from and not internally connected to the source electrode 110 of the array of MOSFET cells 108, so that tests and measurements can be carried out separately on the monitor diode 702.

The area of the monitor diode 702 is made at least one order of magnitude smaller than the aggregate area of the array of cells 108 or of the avalanche current protection diode 406, if present. In this example of this embodiment of the invention, the active area of the monitor diode 702 is less than 1% of the active area of the array of MOSFET cells 108. In the example referred to above, where the aggregate active area of the array of MOSFET base cells 108 is 56 mm$^2$ (56 000 000 µm$^2$), in this example the active area of the monitor diode 702 is 40 000 µm$^2$, less than 0.1% of the active area of the array of MOSFET cells 108. Accordingly avalanche current densities in the monitor diode 702 approaching or exceeding the operational avalanche current densities of the transistor power switch can be achieved during test with smaller total avalanche current. Such avalanche current densities in the monitor diode 702 can be produced even during wafer or die probing, since they correspond to avalanche currents of only a few Amperes, for example, compared to hundreds of Amperes in the transistor power switch device itself. In one example, avalanche current densities in the monitor diode 702 of 1 kA/cm$^2$ were obtained during wafer and die probing. Moreover, mono-pulse UIS characteristics can be measured on the monitor diode 702 with no risk of damaging the cells 108, or even the monitor diode 702 itself, so that these tests can be performed on products that are to be delivered to the customer. Even repetitive UIS testing can be performed on the monitor diode 702 without risk of damaging the cells 108 and only a limited risk of damaging the monitor diode 702 and can be performed during wafer or die probing, before further costly production steps such as packaging. The monitor diode 702 can also be used in forward biased measurements to estimate the metal-semiconductor contact resistance at the face 104 of the substrate 102. Also the volume doping profile of the substrate 102 can be estimated from the anode to cathode capacitance of the diode 702.

Figure 8:
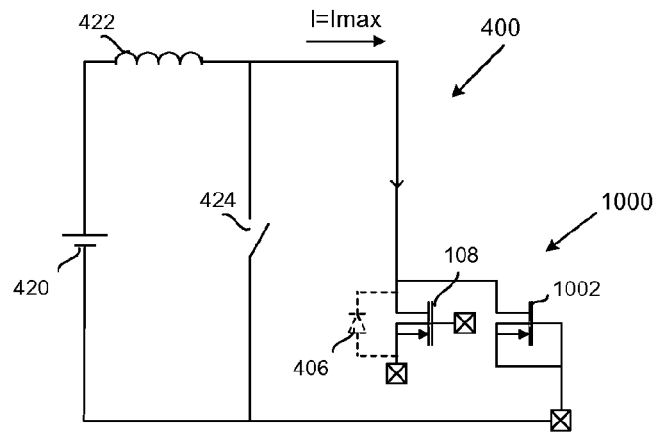
FIG. 8 is a schematic circuit diagram of a circuit for applying unclamped inductive switching voltages to a transistor power switch device, including a different semiconductor monitor element, in accordance with another embodiment of the invention, given by way of example.
Figure 9:
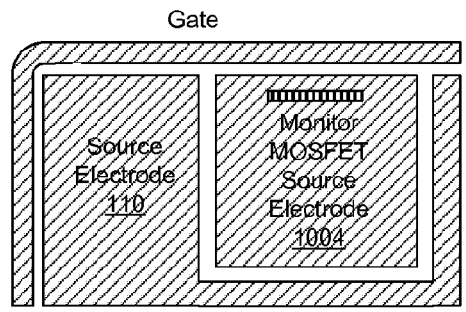
FIG. 9 is a plan view of part of the transistor power switch device of FIG. 8 including the semiconductor monitor element.
Figure 10:
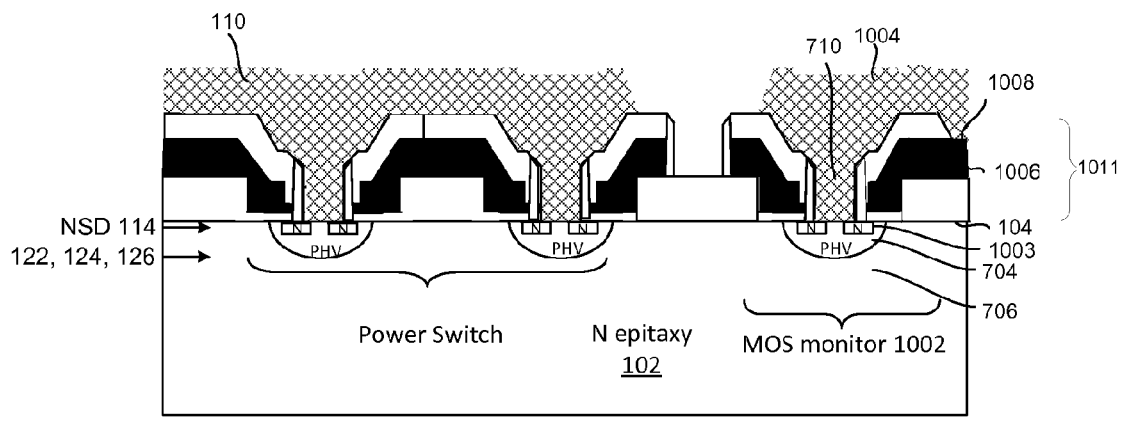
FIG. 10 is a sectional view of the transistor power switch device of FIG. 8 including the semiconductor monitor element.
Figure 11:
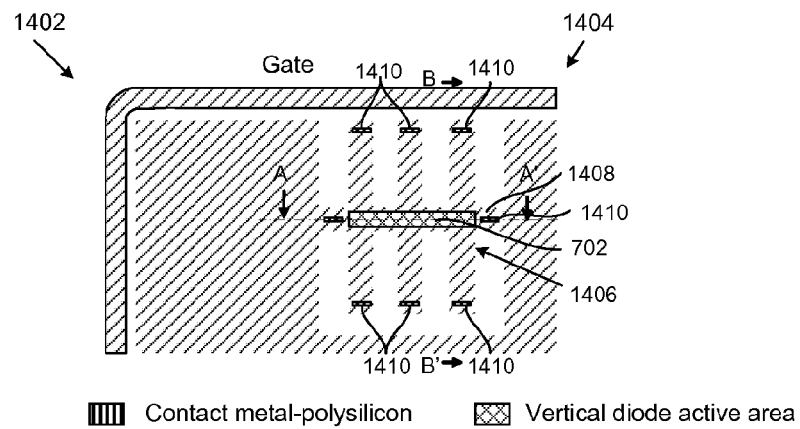
FIG. 11 is a plan view of part of another transistor power switch device, including yet another semiconductor monitor element, in accordance with another embodiment of the invention, given by way of example.
Figure 12:
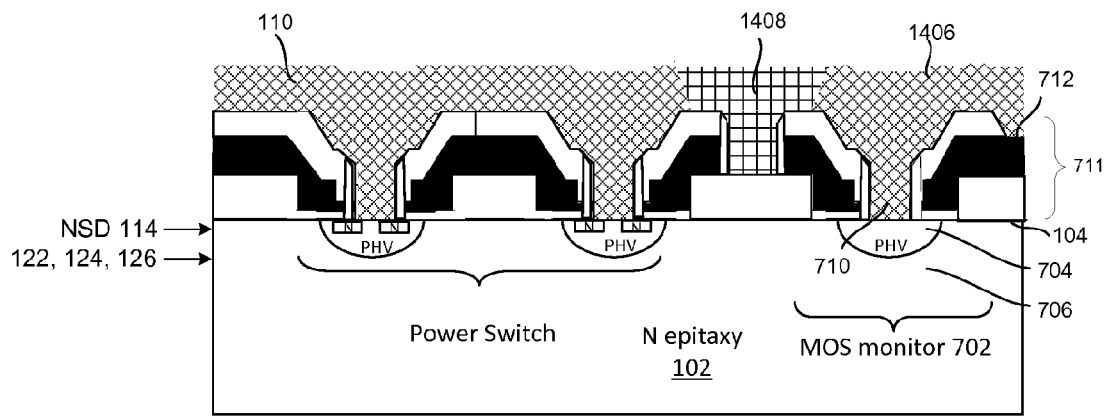
FIG. 12 is a sectional view of the transistor power switch device of FIG. 11 on the line A-A' including the semiconductor monitor element.
Figure 13:
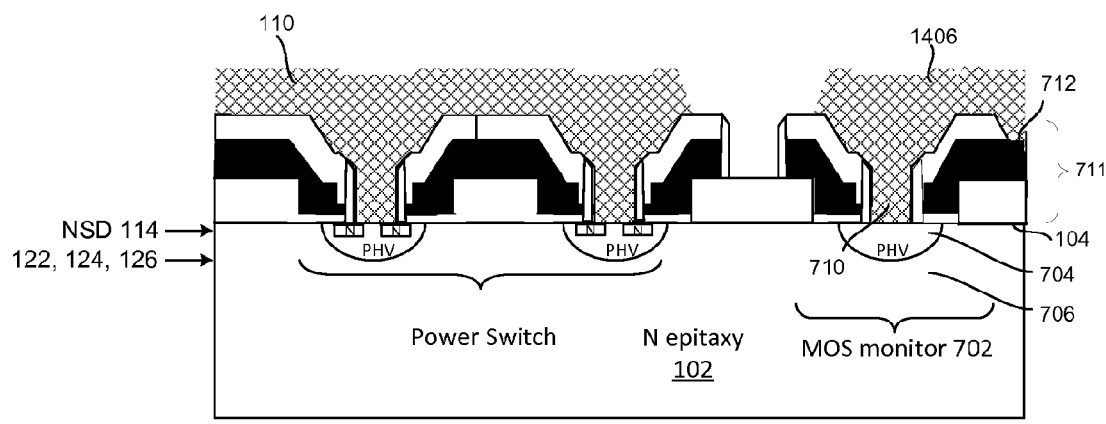
FIG. 13 is a sectional view of the transistor power switch device of FIG. 11 on the line B-B' including the semiconductor monitor element.

FIGS. 8 to 10 of the drawings show a transistor power switch device 1000 similar to the transistor power switch device 100 but with the addition of a vertical monitor MOSFET 1002 formed in the substrate 102 at the face 104 by the same manufacturing steps as the array of MOSFET cells 108 and with a source region 1003 like the source regions 114 of the cells 108. Accordingly, the doping densities and depths of the source region 1003, and the PHV, PSD and BPI regions 704 of the monitor MOSFET 1002 are representative of the corresponding source region 114, and the PHV, PSD and BPI regions 122, 124, 126 of the cells 108 of the power switch 1000. The monitor MOSFET 1002 has a source electrode 1004 which is distinct from and separate from the source electrode 110 and is accessible to probes, and a gate electrode 1006 which is formed in the polysilicon layer of the device 1000 but is distinct, separate and insulated from the gate electrode 116 of the cells 108 of the power switch 1000. The gate electrode 1006 is formed in a gate structure 1011 similar to, and formed simultaneously with and by the same manufacturing steps as the gate stacks 116 to 120 of the MOSFET elements 108. The source electrode 1004 of the monitor MOSFET 1002 is shorted to its gate 1006 through an aperture 1008 in the layer 120 insulating the gate, 1006 from the source electrode 110.

Like the diode 702, the area of the monitor MOSFET 1002 is made at least one order of magnitude smaller than the aggregate area of the array of cells 108 or of the avalanche current protection diode 406, if present. In this example of this embodiment of the invention, the active area of the monitor diode MOSFET 1002 is less than 1% of the active area of the array of the array of MOSFET cells 108. In the example referred to above, where the aggregate active area of the array of MOSFET base cells 108 is 56 mm$^2$ (56 000 000 µm$^2$), in this example the active area of the monitor MOSFET 1002 is 30 000 µm$^2$, less than 0.1% of the active area of the array of MOSFET cells 108. Accordingly avalanche current densities in the monitor MOSFET 1002 approaching or exceeding the operational avalanche current densities of the transistor power switch can be achieved during test. Again, such avalanche current densities in the monitor MOSFET 1002 can be produced even during wafer or die probing, since they correspond to avalanche currents of only a few Amperes, for example. Moreover, mono-pulse UIS characteristics can be measured on the monitor MOSFET 1002 with no risk of damaging the cells 108 or even the monitor MOSFET 1002 itself, so that these tests can be performed on products that are to be delivered to the customer. In particular, the breakdown voltage of the monitor MOSFET 1002 is representative of the breakdown voltage $BV_{DSS}$ of the complete transistor power switch 1000, since the current densities are similar, and can be measured during wafer or die probing, since the avalanche currents in the monitor MOSFET 1002 are sufficiently low. Even repetitive UIS testing can be performed on the monitor MOSFET 1002 without risk of damaging the cells 108 and only a limited risk of damaging the monitor MOSFET 1002. Also the volume doping profile of the substrate 102 can be estimated from the drain to source capacitance of the MOSFET 1002.

The metal source electrode 110 over the array of MOSFET elements 108 of the transistor power switch devices 100, 700 and 1000 is subjected to phenomena of heating, stress due to crystalline mismatch with the substrate 102 at the face 104 and ageing. A variation of the sheet resistance of the metal source electrode 110 due to these phenomena is sufficiently correlated with the repetitive fluctuations of temperature to be used as an indication of metal source ageing a transistor power switch device like 100, 700 or 1000 has been subjected to in operational usage in the field. This requires a repeatable and reliable method of measuring a parameter related to the sheet resistance. Sheet resistance of the conductive layers such as the source electrode layer 110 can be measured by wafer or die probing using the van der Pauw method by applying a voltage at a first pair of contacts spaced apart along a first edge of a test area at the surface of the layer 110, measuring the resulting current flowing between the first pair of contacts and measuring the voltage drop between a second pair of contacts spaced apart along a second edge of the test area at the surface of the layer 110, the second edge being spaced apart laterally from and generally parallel to the first edge. The article "Design and Application of the Interlayer van der Pauw Resistor Alignment Bridge" by Feldbaumer, Varker, Griswold, and Allen in IEEE Transactions on Semiconductor Manufacturing Vol. 3 No. 4, November 1990 describes a different use of an interlayer van der Pauw (VDP) resistor to measure mask alignment, interlayer registration and mask superposition errors.

FIGS. 11 to 16 show schematically an example of a transistor power switch device 1402 which includes an array of MOSFET cells 108 of which only one is shown in the drawings for simplicity. It would be possible to measure the sheet resistance of the source electrode 110 of the transistor power switch device 1402 directly, by probing the source electrode 110 at four positions over the array of MOSFET cells 108, for example. However, in this example, a separate semiconductor monitor element 1404 is provided. The measurement of a parameter related to the sheet resistance can be made on a monitor element of adapted shape by probing, for example, eliminating the variability of contact resistance, even on a finished die that is to be packaged and delivered to a customer.

Figure 5:
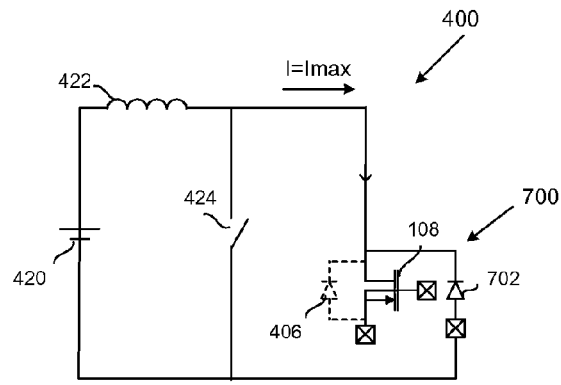
FIG. 5 is a schematic circuit diagram of a circuit for applying unclamped inductive switching voltages to a transistor power switch device, including a semiconductor monitor element, in accordance with one embodiment of the invention, given by way of example.

In this example, the semiconductor monitor element 1404 comprises a vertical monitor diode 702, similar to that shown in FIG. 5, formed in the substrate 102 at the face 104 simultaneously with the array of MOSFET cells 108 and by the same manufacturing steps as the array of MOSFET cells 108 but without a source region like the source regions 114 of the cells 108. Accordingly, the doping densities and depths of the anode and cathode regions 704 and 706 of the monitor diode 702 are of the same types as, and are representative of, the corresponding regions of the MOSFET cells 108 of the power switch 700 respectively.

The area of the monitor diode 702 of the device 1402 is made at least one order of magnitude smaller than the aggregate area of the array of cells 108 or of the avalanche current protection diode 406, if present. In this example of this embodiment of the invention, the active area of the monitor diode 702 is less than 1% of the active area of the array of the array of MOSFET cells 108. In the example referred to above, where the aggregate active area of the array of MOSFET base cells 108 is 56 mm$^2$ (56 000 000 $\mu$m$^2$), the active area of the monitor diode 702 is 40 000 $\mu$m$^2$, less than 0.1% of the active area of the array of MOSFET cells 108.

The monitor element 1404 also comprises an anode electrode 1406 which connects to the p-type anode region 704 of the diode 702 at the face 104 of the substrate 101 through a first aperture 710 in a gate structure 711 corresponding to the gate stacks 116, 118, 120 of the MOSFET elements 108. The anode electrode 1406 of the monitor diode 702 is distinct and separate from the source electrode 110. The anode electrode 1406 is connected permanently to source electrode 110 by the bridge 1408 and is accessible to probes, but it is manufactured in the same material and by the same manufacturing steps as the source electrode 110 so that it exhibits identical intrinsic characteristics. In this embodiment of the invention, the anode electrode 1406 of the monitor diode 702 is connected to the source electrode 110 by a bridge element 1408 in the same material and made at the same time as source electrode 110 and is accessible to probes. The anode electrode 1406 is also shorted to the polysilicon layer of the gate 116 through an aperture 712 in the gate structure 711. In this example, the anode electrode 1406 presents an elongate strip element 1802 connecting the two bridge elements 1408 above the active area of the diode 702 and contacting the anode region 704 through the aperture 710 in the gate structure 711. The monitor element 1404 also comprises two bridge elements 1408 connecting the ends of the elongate strip element 1802 to the source electrode layer 110 of the power MOSFET cells 108.

Figure 16:
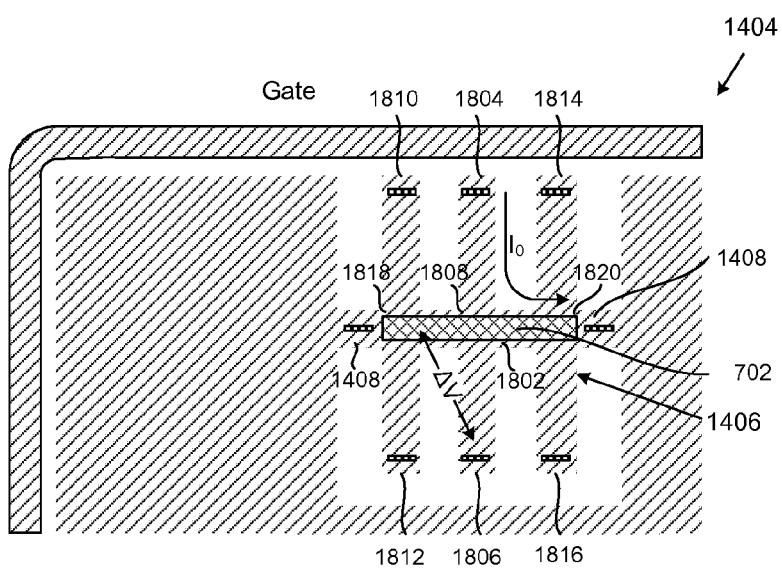
FIG. 16 is an enlarged plan view of part of the transistor power switch device in the test circuit of FIG. 15, in test operation.

As shown in more detail in FIG. 16, the monitor element 1404 also comprises first and second lateral extensions 1804 and 1806 of the central elongate strip element 1802 extending transversely to the length of the central elongate strip element 1802 on opposite sides thereof. The lateral extensions 1804 and 1806 have the same width as the central elongate strip 1802 so as to define with the strip at their intersection 1808 a region of square shape in the middle of the diode active area and of the strip 1802. In this example, the diode 702 is provided with four more such lateral extensions 1810, 1812, 1814 and 1816, similar to the extensions 1804 and 1806. The lateral extensions 1810 and 1812 intersect the central elongate strip 1802 in an intersection region 1818 of square shape at one end of the diode active area and the lateral extensions 1814 and 1816 intersect the central elongate strip 1802 in an intersection region 1820 of square shape at the opposite end of the diode active area. The monitor element 1404 is disposed so as to be accessible for probing in a finished wafer or finished die which can subsequently be used to produce products delivered to customers. Specifically the central elongate strip 1802 and the pairs of lateral extensions are accessible for simultaneous contact by four probes. The operation of probing is facilitated by the elongate shape of the central strip 1802 and by the lateral extensions 1804, 1806 and 1810 to 1816.

Figure 14:
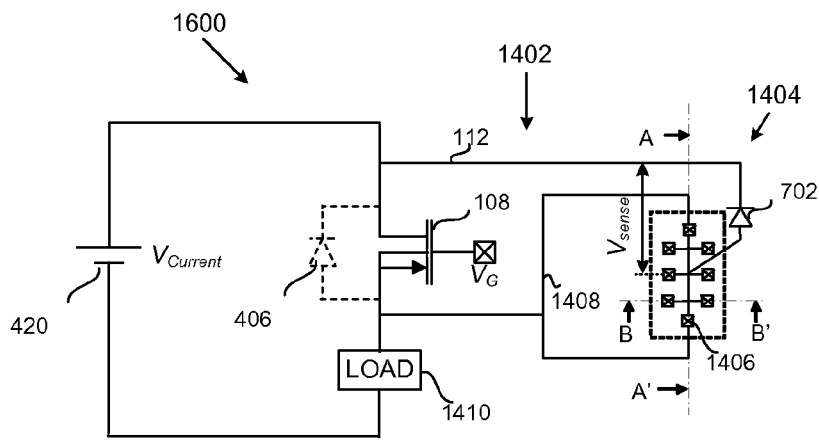
FIG. 14 is a schematic circuit diagram of a power switch circuit including the transistor power switch device of FIGS. 11 to 13, in accordance with an embodiment of the invention, given by way of example.

In normal usage operation of the transistor power switch device 1402 in a power switch circuit 1600, as shown in FIG. 14, a source 420 in the circuit 1400 applies a normal operating voltage $V_{current}$ across the series connection of the source and drain electrodes 110 and 112 of the power MOSFET cell elements 108 of the transistor power switch device 1402 and a load 1410, and also across the drain electrode 112 and the anode electrode 1406 of the monitor element 1404, because of the permanent bridge connections 1408 of the anode electrode 1406 to the source electrodes 110. The voltage $V_G$ at the gate 120 of the array of power MOSFET cell elements 108 is controlled to turn them ON and OFF.

Figure 15:
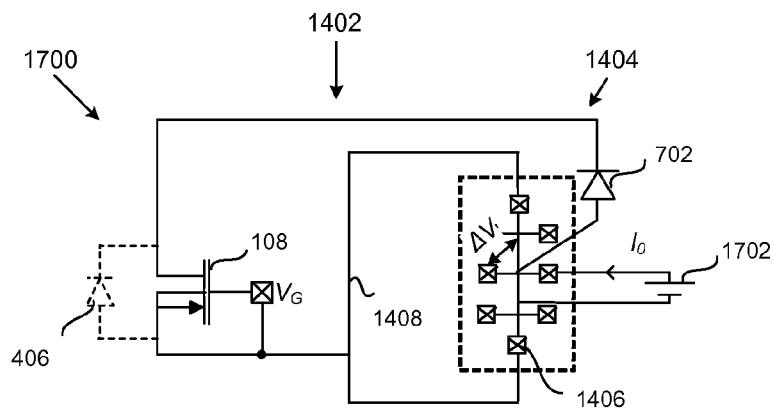
FIG. 15 is a schematic sectional view of a test circuit for measuring a sheet resistance of the transistor power switch device of FIGS. 11 to 13 in accordance with an embodiment of the invention, given by way of example.

In test operation, as shown in FIGS. 15 and 16, in order to measure a parameter related to the sheet resistance of the metal layer of the power switch device 1402, whether on a new wafer or die or on a device after use, the device is included in a probe test circuit 1700 including a source 1702 of test current $I_0$. Two probes are applied to defined locations spaced apart along the central elongate strip 1802 of the anode electrode 1406 on opposite sides of one of the square intersections 1808, 1818 or 1820 and two more probes are applied to defined locations on the corresponding pair of lateral extensions 1804, and 1806, 1810 and 1812 or 1814 and 1816 on opposite sides of the same square intersection 1808, 1818 or 1820. The sheet resistance parameter is measured by applying a measured test current $I_0$ between a probe applied to a first location on one of the lateral extensions and a probe applied to a first location on the central elongate strip 1406. A corresponding voltage $\Delta V$ is developed between two probes applied to a second location on the central elongate strip 1406 and a second location on one of the lateral extensions, the second locations being on the opposite sides of the same square intersection to the first locations, respectively. The sheet resistance is proportional to the ratio of the voltage $\Delta V$ to the current $I_0$. In the example shown in FIG. 16, the current $I_0$ is applied through adjacent sides of the square intersection 1808 between a first location on the extension 1804 and a first location on the central elongate strip 1406 between the intersection 1808 and the intersection 1820 as shown by the arrow $I_O$. The voltage $\Delta V$ is measured between a second location on the extension 1806 and a second location on the central elongate strip 1406 between the intersection 1808 and the intersection 1818 as shown by the by the arrow $\Delta V$. The voltage $\Delta V$ is measured with a high input impedance instrument, to avoid drawing any substantial current through the contacts of the voltage measurement probes with the anode electrode 1406. The sheet resistance is calculated as the ratio of the two values $\Delta V/I_O$. Since the power MOSFET cell elements 108 are turned OFF and the diode 702 is reverse biased, the current $I_O$ essentially only flows through the anode electrode 1406 of the monitor element 1404.

Since the anode electrode 1406 of the monitor element 1404 is permanently connected to the source electrodes 110 of the power MOSFET elements 108 by the bridge element(s) 1408, and the cathode region 706 of the monitor element 1404 is in permanent contact with the drain electrode 112 of the power MOSFET elements 108, the monitor element 1404 is subject in use to the same voltages, including repetitive UIS voltages, as the power MOSFET elements 108. Since the monitor element 1404 is manufactured using the same manufacturing steps as the power MOSFET elements 108, the doping densities and depths of the anode and cathode of the monitor element 1404 and the metal layer and metallic intrinsic characteristics of the anode 1406 are representative of the corresponding elements of the MOSFET cells 108. The gate structure 711 in the diode is shorted to its anode electrode 1406 and is at the same voltage as the gate electrode 116 in the OFF condition of the power MOSFET cells 108. Accordingly the diode 702 is subjected to avalanche current in the same way as the power MOSFET cell elements 108 when UIS voltages occur and it has the same characteristics in avalanche current conditions as the cells 108. The temperature of the diode 702 reacts to avalanche current in the same way as that of the power MOSFET cell elements 108 because of the similar thermal insulation of the substrate 102 by the gate structure 711. Accordingly, the anode electrode 1406 of the monitor element 1404 is subjected to the same phenomena of heating, stress due to crystalline mismatch with the substrate 102 at the face 104 and ageing as the metal source electrode 110 over the array of MOSFET elements 108 of the transistor power switch devices 100, 700 and 1000 and reacts to these phenomena in a similar way to the source electrode 110. It follows that measurement of the variation in time of the sheet resistance of the 1406 of the monitor element 1404 is representative of the variation in time of the sheet resistance of the metal source electrode 110.

Accordingly a method of monitoring source metal ageing to which the transistor power switch device 1402 has been subjected comprises recording a parameter, $\Delta V/I_O$, which is representative of the sheet resistance of the anode electrode 1406 of the monitor element 1404 when the transistor power switch device is new and comparing the recorded value of the parameter with the value of the sheet resistance of the anode electrode 1406 of the monitor element 1404 after use of the same power switch device 1402.

Since there are three square intersections 1808, 1818 or 1820 in the elongate strip 1802 of the anode electrode 1406, the sheet resistance can be measured at different positions above the monitor diode 702. The sheet resistance at the different positions can be compared to detect differences of behaviour, for example between the centre of the diode and its ends. When the measurements are made for intersections 1818 or 1820 close to an end of the elongate strip 1802, the location for one of the probes can be beyond the end of the elongate strip 1802 itself, on the bridge element 1408 or the adjacent portion of the source electrode 110, for example.

The initial value of the sheet resistance of the anode electrode 1406 of the monitor element 1404 of a production sample of the transistor power switch device 1402 can also be calculated and used to monitor the quality of the metal deposition of production batches.

In one example, repetitive avalanche current testing can be performed on production samples during probing, the values of the sheet resistance of the anode electrode 1406 of the monitor element 1404 being compared before and after avalanche current testing.

In the above description, reference is made to conductive elements being accessible for probing. Accessibility for probing is a function of the kind of monitoring or testing or measurement that the device has been designed and specified for. In many cases, accessibility for probing implies that the conductive element to be probed is on the top (front) side, with standard top metallization. Its size is suitable for standard probing needles' size and after assembly to a package unit, the conductive element can be probed using a micromanipulator before the package is closed. In the case of a packaged product, for example a field return, it will typically be necessary to uncover the package to be able to probe and perform tests and measurements.

In the example referred to above, where the aggregate active area of the array of MOSFET base cells 108 is 56 mm$^2$ (56 000 000 μm$^2$), and the active area of the monitor diode 702 is 40 000 μm$^2$, an example of the width of the elongate strip element 1802 and lateral extensions 1804, 1806, 1810, 1812, 1814 and 1816 is 25 μm. In this example, the lateral extensions 1804, 1806, 1810, 1812, 1814 and 1816 are of length 30 μm and are spaced apart by 30 μm (the drawings not being to scale in this respect).

Various different types of embodiments of the monitor elements 702, 1002 and 1404 have been described. It will be appreciated that a switch device in accordance with an embodiment of the invention may include two or more different types of embodiments of the monitor elements 702, 1002 and 1404. In one example, there are four monitor zones on the power switch chip with different types of embodiments of the monitor elements 702, 1002 and 1404 and with other types of monitor element, individually or in different combinations.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Where the context admits, it will be understood that the semiconductor substrate described herein can be any semiconductor material or combinations of materials, such as gallium arsenide, silicon germanium, silicon-on-insulator (SOI), silicon, monocrystalline silicon, the like, and combinations of the above.

Where the apparatus implementing the present invention is composed of electronic components and circuits known to those skilled in the art, circuit details have not been explained to any greater extent than that considered necessary for the understanding and appreciation of the underlying concepts of the present invention.

Where the context admits, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Where the context admits, illustrated hardware elements may be circuitry located on a single integrated circuit or within a same device or may include a plurality of separate integrated circuits or separate devices interconnected with each other. Also, hardware elements in an embodiment of the invention may be replaced by software or code representations in an embodiment of the invention.

Furthermore, it will be appreciated that boundaries described and shown between the functionality of circuit elements and/or operations in an embodiment of the invention are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In the claims, any reference signs placed between parentheses shall not be construed as limiting the claim. Where the context admits, terms such as "first" and "second" are used to distinguish arbitrarily between the elements such terms describe and these terms are not necessarily intended to indicate temporal or other prioritization of such elements.

The invention claimed is:

1. A transistor power switch device comprising:
   a semiconductor body presenting opposite first and second faces,
   an array of vertical transistor elements for carrying current between said first and second faces, said array of transistor elements comprising:
   at said first face an array of first current carrying transistor regions of a first semiconductor type; and
   at said second face a second current carrying transistor region of said first semiconductor type;
   at least one third current carrying transistor region of a second semiconductor type opposite to said first type interposed between said first semiconductor regions and said second current carrying transistor region;
   at least one control electrode for switchably controlling flow of said current through said third transistor region; and
   a current carrying conductive layer contacting said first current carrying transistor regions at said first face;
   said transistor power switch device also comprising:
   at least one semiconductor monitor element presenting semiconductor properties representative of said vertical transistor elements of said array whereby measurement of intrinsic characteristics of said semiconductor monitor element is representative of intrinsic characteristics of said vertical transistor elements, said semiconductor monitor element comprising:
   first and second semiconductor monitor regions in said semiconductor body electrically in contact with said first and second faces respectively; and
   a monitor conductive layer distinct from said current carrying conductive layer contacting said first semiconductor monitor region at said first face.

2. A transistor power switch device as claimed in claim 1, wherein said semiconductor monitor regions and said monitor conductive layer of said monitor element have been manufactured by the same manufacturing steps as corresponding semiconductor regions and said current carrying conductive layer of said vertical transistor elements of said array.

3. A transistor power switch device as claimed in claim 1, wherein said first semiconductor monitor region of said semiconductor monitor element occupies an active area at said first face which is at least one order of magnitude smaller than the aggregate active areas of said first current carrying transistor regions of said array.

4. A transistor power switch device as claimed in claim 1, wherein said semiconductor monitor element is permanently connected in parallel to said array of transistor elements, whereby to be subjected to the same operating voltages of said current carrying conductive layers in use.

5. A transistor power switch device as claimed in claim 1, wherein said semiconductor monitor element comprises a vertical transistor element presenting characteristics representative of characteristics of said vertical transistor elements of said array.

6. A transistor power switch device as claimed in claim 1, wherein said semiconductor monitor element comprises a vertical diode, said first semiconductor monitor region being of said second semiconductor type and said second semiconductor monitor region being of said first semiconductor type.

7. A transistor power switch device as claimed in claim 6, wherein said semiconductor monitor element comprises a monitor electrode and insulating layer structure similar to a structure of said control electrode and said at least one insulating layer of said array of transistor elements, said monitor electrode and insulating layer structure being interposed between said monitor conductive layer and said first face.

8. A transistor power switch device as claimed in claim 1, wherein said monitor conductive layer comprises:
   an elongate strip element; and
   at least one pair of lateral extensions to said elongate strip element extending transversely to the length of a central elongate strip element on opposite sides thereof and defining an intersection with said elongate strip element, whereby a test current may be applied between a first location on one of said pair of lateral extensions and a first location on said elongate strip element so as to develop a corresponding voltage between a second location on the other of said pair of lateral extensions and a second location on said elongate strip element, said second locations being on opposite sides of said intersection to said first locations, respectively, and said test current and said corresponding voltage may be measured.

9. A transistor power switch device as claimed in claim 8, wherein said semiconductor monitor element comprises a plurality of said pair of lateral extensions defining a plurality of said intersections with said elongate strip element spaced apart laterally of said first face along said elongate strip element.

10. A method of measuring a characteristic of a transistor power switch device, wherein the transistor power switch device includes:
    a semiconductor body presenting opposite first and second faces;
    an array of vertical transistor elements for carrying current between said first and second faces, said array of transistor elements comprising:
    at said first face an array of first current carrying transistor regions of a first semiconductor type; and
    at said second face a second current carrying transistor region of said first semiconductor type;

at least one third current carrying transistor region of a second semiconductor type opposite to said first type interposed between said first semiconductor regions and said second current carrying transistor region;

at least one control electrode for switchably controlling flow of said current through said third transistor region; and a current carrying conductive layer contacting said first current carrying transistor regions at said first face;

said transistor power switch device also comprising:

at least one semiconductor monitor element presenting semiconductor properties representative of said vertical transistor elements of said array whereby measurement of intrinsic characteristics of said semiconductor monitor element is representative of intrinsic characteristics of said vertical transistor elements, said semiconductor monitor element comprising:

first and second semiconductor monitor regions in said semiconductor body electrically in contact with said first and second faces respectively, and a monitor conductive layer distinct from said current carrying conductive layer contacting said first semiconductor monitor region at said first face;

the method comprising measuring a characteristic of said semiconductor monitor element.

11. A method of measuring a parameter of a transistor power switch device as claimed in claim 10, wherein said monitor conductive layer comprises:

an elongate strip element; and at least one pair of lateral extensions to said elongate strip element extending transversely to the length of a central elongate strip element on opposite sides thereof and defining an intersection with said elongate strip element, whereby a test current may be applied between a first location on one of said pair of lateral extensions and a first location on said elongate strip element so as to develop a corresponding voltage between a second location on the other of said pair of lateral extensions and a second location on said elongate strip element, said second locations being on opposite sides of said intersection to said first locations, respectively, and said test current and said corresponding voltage may be measured, the method further comprising:

applying a current between said first location on one of said pair of lateral extensions and said first location on said elongate strip element so as to develop a corresponding voltage between said second location on the other of said pair of lateral extensions and said second location on said elongate strip element;

measuring said current flowing between said first locations; and measuring said corresponding voltage.

12. A method of monitoring source metal ageing to which a transistor power switch device has been subjected, the transistor power switch device comprising:

a semiconductor body presenting opposite first and second faces;

an array of vertical transistor elements for carrying current between said first and second faces, a current carrying conductive layer at said first face contacting said vertical transistor elements;

at least one semiconductor monitor element comprising first and second semiconductor monitor regions in said semiconductor body electrically in contact with said first and second faces respectively, and a monitor conductive layer distinct from said current carrying conductive layer contacting said first semiconductor monitor region at said first face, the method comprising:

measuring and recording a parameter which is a function of a sheet resistance of said monitor conductive layer when the transistor power switch device is new; and comparing the recorded value of said parameter with a value of said parameter after operation of the same power switch device.

13. A method of monitoring source metal ageing to which a transistor power switch device has been subjected as claimed in claim 12, wherein said monitor conductive layer comprises an elongate strip element and at least one pair of lateral extensions to said elongate strip element extending transversely to the length of a central elongate strip element on opposite sides thereof and defining an intersection with said elongate strip element; and said method comprises:

applying a test current between a first location on one of said pair of lateral extensions and a first location on said elongate strip element so as to develop a corresponding voltage between a second location on the other of said pair of lateral extensions and a second location on said elongate strip element, said second locations being on opposite sides of said intersection to said first locations, respectively; and measuring said test current and said corresponding voltage.

14. A method of monitoring source metal ageing to which a transistor power switch device has been subjected as claimed in claim 12, wherein said semiconductor monitor element comprises:

a plurality of said pairs of lateral extensions defining a plurality of said intersections with said elongate strip element spaced apart laterally of said first face along said elongate strip element.

* * * * *